United States Patent [19]

Hill

[11] Patent Number: 4,700,126

[45] Date of Patent: Oct. 13, 1987

[54] VEHICULAR LAMP CIRCUIT TESTER

[76] Inventor: John R. Hill, 3768 Grassmere Dr., Corpus Christi, Tex. 78415

[21] Appl. No.: 770,432

[22] Filed: Aug. 29, 1985

[51] Int. Cl.$^4$ ............................................. G01R 31/02
[52] U.S. Cl. .................................... 324/510; 340/642; 439/219; 439/483; 439/638
[58] Field of Search .................. 324/51; 340/641, 642; 339/14 P, 113 L

[56] References Cited
U.S. PATENT DOCUMENTS

| | | | |
|---|---|---|---|
| 2,428,441 | 10/1947 | Waters | 340/641 X |
| 3,944,915 | 3/1976 | Yonce | 324/51 |
| 4,254,374 | 3/1981 | Trihus | 324/51 X |
| 4,258,313 | 3/1981 | Cheatham, Jr. et al. | 324/51 |

Primary Examiner—Stanley T. Krawczewicz
Attorney, Agent, or Firm—G. Turner Moller

[57] ABSTRACT

An automobile circuit tester is provided having an end connection receivable in the taillight socket, parking light socket, brake light socket or directional signal socket in place of the bulb. When a circuit is completed to the socket in which the tester is received, an audible signal is generated.

8 Claims, 4 Drawing Figures

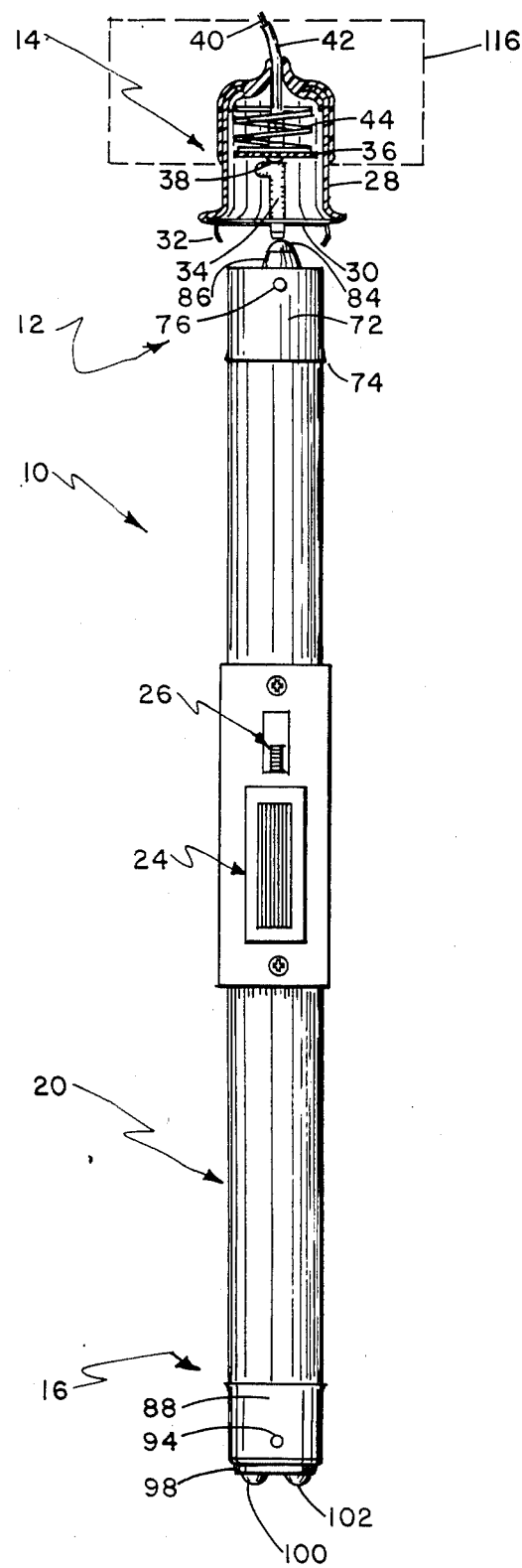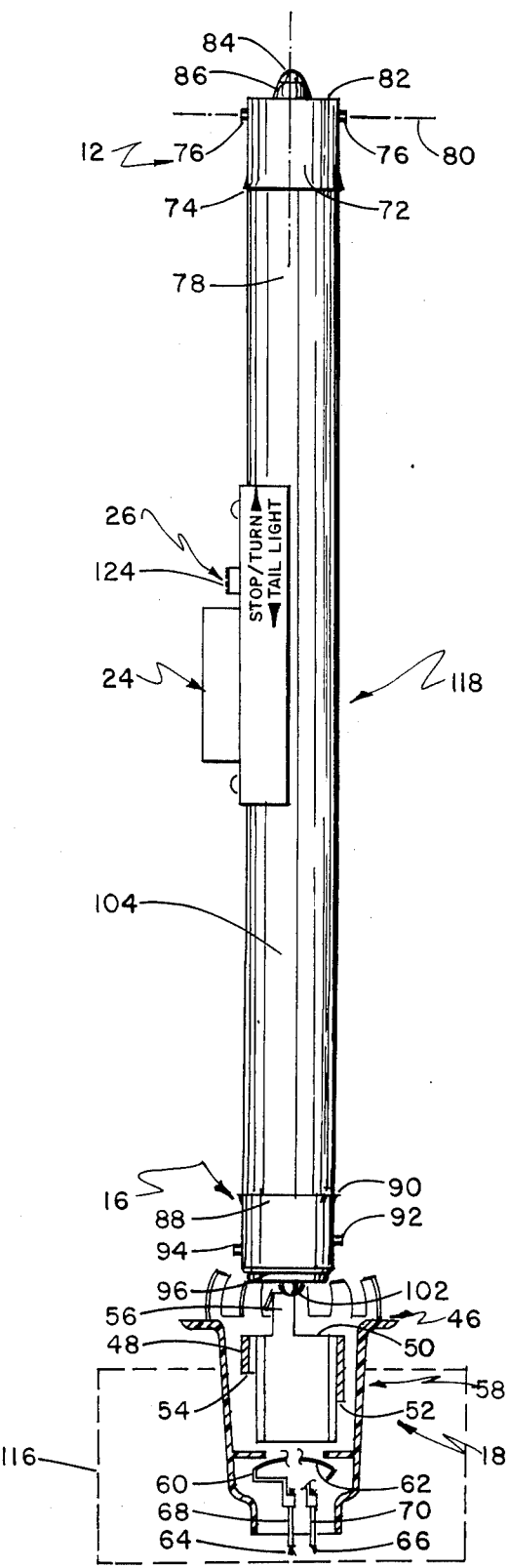
FIG. 1
FIG. 2

VEHICULAR LAMP CIRCUIT TESTER

This invention relates to an automobile lamp circuit tester and more particularly to a device which is used to locate faults, shorts or the like in the electrical circuit leading to a vehicular brake light, taillight, parking light or directional signal light.

One of the most aggravating tasks facing a mechanic is trouble-shooting to determine why a brake light, taillight, parking light or directional signal light is not working. There are two problems. First, two people are generally required because one has to watch the light that is inoperable. Second, the circuit defect might be anywhere and is not subject to easy detection. The first things that are done are those things which experience indicates are common causes, i.e. a defective bulb, a burned out fuse, a defective flasher and the like. Very soon, the task is hit or miss and blind luck.

So far as is known, no commercially available circuit testers are directed to this problem. Disclosures of some interest relating to this invention are found in U.S. Pat. Nos. 3,944,915; 4,254,374 and 4,258,313.

In summary, this invention comprises a circuit tester for automobile taillights, parking lights, directionl signal lights or other applications, e.g. trailers, where automotive bulbs are used. The circuit tester of this invention includes a male fitting substantially identical to the male bulb fitting so the tester inserts directly into the female socket comprising part of the circuit to be tested. The tester includes an internal circuit providing an audible signal generator energized when the vehicle circuit is completed to the socket into which the tester is inserted. In this fashion, a mechanic can insert the tester into the socket which is not operable and thereafter conduct tests and trouble-shooting procedures. Whenever the vehicular circuit is completed, either as a result of intentional trouble-shooting procedures or accidentally as by jiggling a wire, the audible signal generator is activated thereby informing the mechanic that the difficulty has been identified. The use of an audible alarm eliminates the necessity of a helper.

As will be more fully apparent hereinafter, the disclosed circuit tester of this invention is designed for use on two groups of vehicular lamps: a first group having a single element bulb including backup lights, parking lights and taillights; and a second group having a double filament bulb including stop light/ directional signal lights on the rear of a vehicle and directional signal lights on the front of the vehicle. In one embodiment of the invention, a male fitting at one end of the tester is identical to the signal filament bulb fitting receivable in the sockets of the first group of lamps. At the opposite end of the tester, a second male fitting is identical to the double filament bulb fittings of the second group. Thus, one end of the tester may be inserted into the single filament socket of a number of automobile lamp circuits and the other end of the tester may be inserted into the socket of double filament bulb circuits. In this fashion, the same tester can be used to locate faults in a wide variety of vehicular lamp circuits.

Double filament bulbs are energized by completing a circuit through either of the filaments, the return being provided through the fitting to ground. In order to test the circuits leading to each of the filaments of a double filament socket, the tester is provided with a circuit leading to each of the filaments of the tester fitting and a switch to selectively connect the two filaments to a signal generator.

It is accordingly an object of this invention to provide a new and improved circuit tester for vehicular lamp circuits.

Another object of this invention is to provide a vehicular lamp circuit tester which may be used to test circuit continuity in a wide variety of vehicular lamps.

Other objects and advantages of this invention will become more fully apparent as this description proceeds, reference being made to the accompanying drawings and depending claims.

IN THE DRAWINGS

FIG. 1 is a top plan view of one embodiment of a circuit tester of this invention illustrated as exploded out of a conventional single filament socket shown in cross-section;

FIG. 2 is a side elevational view of the circuit tester of this invention illustrated as exploded out of a conventional double filament socket shown in cross-section;

Figure 3:
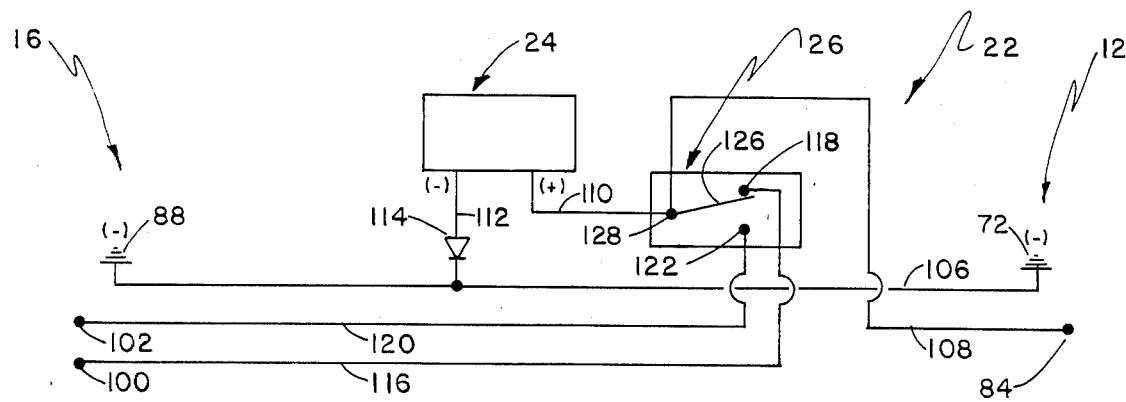
FIG. 3 is a schematic view of the circuit inside the tester of FIGS. 1 and 2.

Referring to FIGS. 1 and 2, a circuit tester 10 of this invention comprises a single filament fitting 12 sized and shaped to be received in a single filament socket 14, a double filament fitting 16 sized and shaped to be received in a double filament socket 18 for testing the circuits meeting thereto. The circuit tester 10 also comprises, as major components, a housing 20 having therein a circuit 22 (FIG. 3) including an audible alarm 24 and a switch 26.

The single filament socket 14 is of conventional design and comprises a generally cylindrical metallic housing 28 having an open end 30 and a plurality of fingers 32. The fingers 32 are typically used to attach the socket 14 to the vehicle. A pair of diametrically opposed J-slots 34 open through the open end 30 of the housing 28. An insulated partition wall 36 carries a conductive bulb contact 38 on the outer end thereof connected to a wire 40 covered by an insulated coating 42. A spring 44 biases the partition wall 36 toward the open end 30 of the housing 28 to a location intermediate the ends of the J-slots 34. As will be apparent to those skilled in the art, the single filament socket 14 is of conventional design and is illustrated as a universal socket of the type available from Geeral Automotive Specialty Company of North Brunswick, New Jersey, as Part Number 34630. The single filament socket 14 is of the type used in a first group of lamps in automobile electrical circuits leading to backup lights, taillights ahd the like.

The double filament socket 18 is likewise of conventional design and comprises a shaped metallic bulb receptacle 46 having a generally closed cylindrical wall 48 providing an opened end 50. A pair of J-slots 52, 54 are provided by the wall 48 and open through the end 50 of the receptacle 46. The receptacle 46 also comprises one or more outwardly extending metallic fingers or prongs 56.

The receptacle 46 is captivated in a plastic housing 58 carrying a pair of bulb contacts 60, 62 separately connected to a wire 64, 66 insulated by an insulating covering 68, 70.

Those skilled in the art will recognize the socket 18 as being of conventional type known as a double contact socket and available from General Automotive Specialty Company of North Brunswick, New Jersey, as Part Number 34200.

The single filament fitting 12 of the circuit tester 10 is substantially identical to the metallic fittings found on the ends of bulbs normally inserted into and captivated by the single filament socket 14. Accordingly, the fitting 12 comprises a metallic generally cylindrical section 72 having a slightly flared inner open end 74 and a pair of diametrically opposed generally cylindrical protuberances 76 extending radially from an axis 78 of the tester 10. The protuberances 76 lie in a common plane 80 equidistant from the metallic end 82 of the fitting 12. The end 82 provides an opening through which extends a bulb type contact 84 insulated from the section 72 by an insulating member 86.

The double filament fitting 16 of the circuit tester 10 is substantially identical to the fittings found on the ends of bulbs normally inserted into the double filament sockets 18. Accordingly, the fitting 16 includes a generally cylindrical metallic section 88 having a slightly flared inner open end 90 and a pair of opposed protuberances 92, 94 extending radially from the axis 78 of the tester 10. The protuberances 92, 94 are differently spaced from the end 96 of the cylindrical section 88. A general cylindrical insulating member 98 is affixed to the end 96 of the section 88 and has a pair of openings therein through which extend bulb type contacts 100, 102. Because of the spacing of the protuberances 92, 94 from the end of the fitting 16, it will be evident that the fitting 16 can be inserted and captivated in the receptacle 46 in only one orientation, i.e. the protuberance 94 is aligned with the J-slot 54 while the protuberance 92 is aligned with the J-slot 52.

The housing 20 of the tester 10 conveniently comprises a length or piece of PVC tubing 104 sized to be closely received in the open ends 74, 90 of the fittings 12, 16.

As shown best in FIG. 3, the circuit 22 comprises a ground wire 106 connected at one end to the cylindrical section 72 and at the other end to the cylindrical section 88. Since the sections 72, 88 are grounded through the bulb sockets 14, 18 it will be evident that the wire 102 of the tester 10 is grounded when either of the fittings 12, 16 is inserted into the fittings 14, 18. The circuit 22 also includes a single filament wire 108 connected at one end to the contact 84 and at the other to the input 110 of the audible alarm 24. The audible alarm 24 may be of any suitable type. Conveniently, it is operated by 12 volt dc which is characteristic of most modern vehicles. The audible alarm 24 may be any suitable type such as an Archer Model 273-055. The output 112 of the alarm 24 is connected to the ground wire 106 by a connection 112 which, if desired, may have a diode 114 therein. It will accordingly be seen that when the single filament fitting 12 is inserted into the socket 14, completion of the vehicular electrical circuit through the wire 40 will energize the alarm 24.

The circuit 22 also includes a wire 116 connecting the contact 100 to a contact 118 of the switch 26. A wire 120 connects the contact 102 to a contact 122 of the switch 26. The switch 26 includes an operator 124 exterior of the housing 20 operatively connected to a switch leg 126 for alternately connecting the contacts 118, 122 to a stationary contact 128 connected to the input 110 of the alarm 24.

The circuit tester 10 is used when troubleshooting to determine the cause of a defective lamp in an automobile or truck lamp circuit. The bulb of that circuit is removed. If the bulb is of the single filament type the fitting 12 is inserted into the bulb socket 14 of the vehicle 116 so that the protuberances 76 enter the J-slot 34. The circuit tester 10 is then rotated so that the housing 20 is latched into and supported by the socket 14. The mechanic is then free to move about, jiggle wires, and do whatever is necessary in an attempt to determine the cause of the circuit failure leading to the socket wire. When the difficulty is located and the circuit is completed to the socket 14, the circuit 22 is complete so that the audible alarm 24 sounds. This accordingly tells the mechanic that the circuit has been completed and that the difficulty has been found. It will be seen that no helper is required.

If the defective bulb is of the double filament type, such as a brake light/directinal signal light, there is usually some indication of which circuit is defective. If it is the taillight, the switch 26 is moved to the tail light position as shown by the label 118. The double filament fitting 16 is inserted into the socket 18 and rotated so that the protuberances 92, 94 enter and latch into the J-slots 52, 54. The circuit tester 10 is accordingly latched into and cantilevered from the socket 18. Troubleshooting procedures are then conducted in an attempt to find the circuit discontinuity. When this discontinuity is located, the vehiculr circuit including the socket 18 is completed which causes the circuit 22 to be completed thereby sounding the alarm 24. In the event the difficulty lies in the other vehicular circuit, the switch 26 is moved to the stop light - turn signal position as shown by the label 118. Troubleshooting procedures are then conducted in an attempt to find the circuit discontinuity. When this discontinuity is located, the vehicular circuit including the socket 18 is completed which causes the circuit 22 to be completed thereby sounding the alarm 24.

It has been learned that most commercially available audible alarms of the type used in the circuit tester 10 of this invention work much better if the alarm faces upwardly rather than downwardly. It will be appreciated that, in use, the circuit tester 10 extends horizontally away from the sockets 14, 18. The audible alarm 24 may be arranged to face upwardly when engaged with the double filament socket 18 by positioning the protuberance 94 closest to the tester end on the same side of the tester 10 as the alarm 24 as is shown in FIG. 2.

Figure 4:
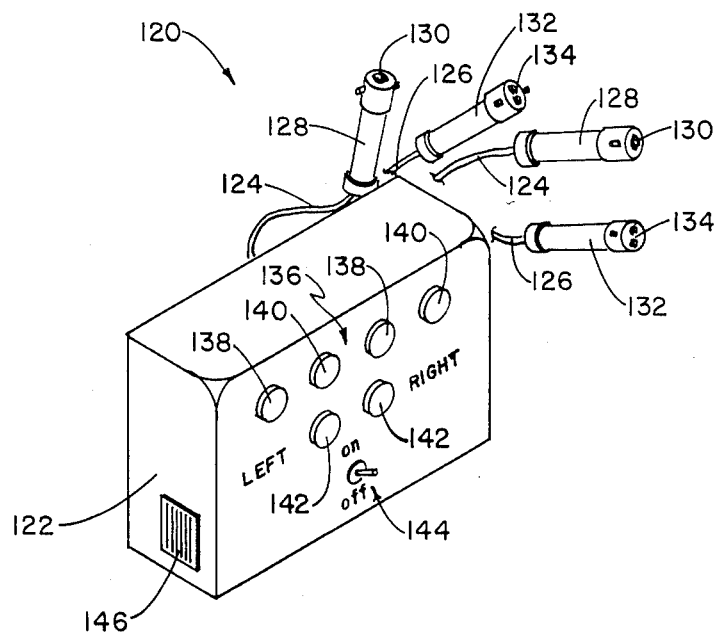
FIG. 4 is an isometric view of another embodiment of a circuit tester of this invention.

One of the difficulties with the circuit tester 10 is that some problems may be encountered in using it in very noisy environments where the signal from the audible alarm generator 24 might be difficult to hear. To overcome this difficulty, the circuit tester 120 shown in FIG. 4 is provided. The circuit tester 120 comprises a housing 122 having a plurality of elongate electrical conductors 124, 126 extending out of the back of the housing 122. The conductors 124 have, on the end thereof, an elongate rigid handle 128 providing a single filament type fitting 130 on the end thereof. The conductors 126 include an elongate rigid handle 132 providing a double filament type fitting 134 on the end thereof. The concept is that the fittings 130, 134 will be inserted into sockets 14, 18 of the defective circuit. The provision of the elongate handle 128, 130 allows the fittings 130, 132 to be inserted into their respective sockets without difficulty. The electrical conductors 124, 126 are sufficiently long that the housing 122 may be placed on the seat of the vehicle to allow the mechanic to work underneath the dash and have the alarms 136 of the circuit tester 120 close at hand.

The alarms 136 may comprise bulbs 138 connected to the electrical conductors 124 and bulbs 140, 142 connected to the conductors 126. Because the bulbs 140, 142 are directly wired to the two circuits of the double filament fittings 134, it will be seen that there is no requirement for a switch comparable to the switch 26 in the embodiment of FIGS. 1-3

The circuit tester 120 does include a switch 144 connected to a buzzer or audible alarm 146 so the mechanic can have an audible alarm close to where he is working.

Although the invention has been described in its preferred forms with a certain degree of particularity, it is understood that the present disclosure is only by way of example and that numerous changes in the details of construction and in the combination and arrangement of parts may be resorted to without departing from the spirit and scope of the invention as hereinafter claimed.

I claim:

1. An automobile circuit tester for determining circuit continuity leading to a first single filament socket of a first lamp type and to a second filament socket of a second lamp type, comprising
   a first single filament fitting sized and shaped to be received in the first socket;
   a second fitting having first and second filaments, the second fitting being sized and shaped to be received in the second socket and being different that the first fitting and not being receivable in the first socket;
   an audible alarm;
   a first circuit interconnecting the alarm with the filament of the first fitting for energizing the alarm when a circuit is completed to the first socket; and
   a second circuit including a switch selectively interconnecting the alarm with the first and second filaments of the second fitting for energizing the alarm when a circuit is completed to the first filament when the switch is in a first position and to the second filament when the switch is in a second position.

2. The circuit tester of claim 1 wherein the first fitting comprises a generally cylindrical metallic section having a pair of diametrically opposed protuberances extending away therefrom, a single filament inside the cylindrical section extending beyond the end thereof and an insulating member surrounding the single filament from the cylindrical section.

3. The circuit tester of claim 1 wherein the second fitting comprises a generally cylindrical metallic section having a pair of axially offset, diametrically opposed protuberances extending away therefrom, the first and second filaments being inside the cylindrical section extending beyond the end thereof and an insulating member surrounding the first and second filaments for insulating the first and second filaments from the cylindrical section.

4. The circuit tester of claim 1 further comprising a housing carrying the first and second fittings and the alarm, the housing having a cavity therein receiving the first and second circuits.

5. The circuit tester of claim 2 wherein the housing comprises an elongate member having a passage therethrough, the passage comprising the cavity, the first fitting being on one end of the elongate member and the second fitting being on the other end thereof.

6. A method for determining the continuity of a vehicle electric circuit leading to a defective one of a plurality of different lamps including a first group of lamps having a single filament socket of a first configuration receiving a bulb therein and a second group of double filament sockets having a second configuration receiving a bulb therein comprising
   removing the bulb from the socket of the defective one of the plurality of lamps;
   inserting a circuit tester into the socket of the removed bulb and latching the circuit tester therein;
   conducting troubleshooting procedures on the vehicle electrical circuit leading to the socket of the defective lamp; and
   energizing an alarm comprising part of the tester in response to completing the circuit to the socket of the defective lamp.

7. The method of claim 6 wherein the inserting step further comprises supporting the circuit tester from the socket of the defective lamp.

8. The method of claim 7 wherein the energizing step comprises creating an audible sound.

* * * * *